US008971118B2

(12) United States Patent
Jin et al.

(10) Patent No.: US 8,971,118 B2
(45) Date of Patent: Mar. 3, 2015

(54) METHODS OF FORMING NON-VOLATILE MEMORY DEVICES INCLUDING VERTICAL NAND STRINGS

(71) Applicants: Beom-jun Jin, Seoul (KR); Byung-seo Kim, Suwon-si (KR); Sung-Dong Kim, Seoul (KR)

(72) Inventors: Beom-jun Jin, Seoul (KR); Byung-seo Kim, Suwon-si (KR); Sung-Dong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 14/164,712

(22) Filed: Jan. 27, 2014

(65) Prior Publication Data
US 2014/0141610 A1   May 22, 2014

Related U.S. Application Data

(63) Continuation of application No. 13/692,334, filed on Dec. 3, 2012, now Pat. No. 8,659,946, which is a continuation of application No. 12/480,399, filed on Jun. 8, 2009, now Pat. No. 8,325,527.

(30) Foreign Application Priority Data

Jun. 11, 2008 (KR) .................... 10-2008-0054710

(51) Int. Cl.
*G11C 16/04* (2006.01)
*G11C 16/06* (2006.01)
*H01L 21/28* (2006.01)
(Continued)

(52) U.S. Cl.
CPC .... *H01L 21/28282* (2013.01); *H01L 27/11519* (2013.01); *H01L 27/11551* (2013.01); *H01L 27/11556* (2013.01); *H01L 27/11565* (2013.01); *H01L 27/11578* (2013.01); *H01L 21/76802* (2013.01)
USPC ................ 365/185.17; 365/185.18; 257/331; 257/324; 257/326

(58) Field of Classification Search
USPC ......... 365/185.17, 185.18; 257/331, 324, 326
See application file for complete search history.

(56) References Cited

U.S. PATENT DOCUMENTS

| 6,858,906 B2 | 2/2005 | Lee et al. |
| 7,253,467 B2 | 8/2007 | Lee et al. |

(Continued)

FOREIGN PATENT DOCUMENTS

| JP | 06-338602 | 12/1994 |
| JP | 2006-128390 | 5/2006 |

(Continued)

OTHER PUBLICATIONS

H. Tanaka et al. in Symp, "Bit Cost Scalable Technology With Punch and Plug Process for Ultra High Density Flash Memory," VLSI Tech. Dig., pp. 14~15 (2007).

(Continued)

*Primary Examiner* — Toan Le
(74) *Attorney, Agent, or Firm* — Myers Bigel Sibley & Sajovec, P.A.

(57) ABSTRACT

A NAND based non-volatile memory device can include a plurality of memory cells vertically arranged as a NAND string and a plurality of word line plates each electrically connected to a respective gate of the memory cells in the NAND string. A plurality of word line contacts can each be electrically connected to a respective word line plate, where the plurality of word line contacts are aligned to a bit line direction in the device.

19 Claims, 23 Drawing Sheets

(51) Int. Cl.
*H01L 27/115* (2006.01)
*H01L 21/768* (2006.01)

(56) References Cited

U.S. PATENT DOCUMENTS

| | | | |
|---|---|---|---|
| 7,315,474 | B2 | 1/2008 | Lue |
| 8,659,946 | B2 * | 2/2014 | Jin et al. .................... 365/185.17 |
| 2004/0094794 | A1 * | 5/2004 | Wu .............................. 257/316 |
| 2004/0188745 | A1 | 9/2004 | Kim et al. |
| 2006/0091556 | A1 | 5/2006 | Shigeoka |
| 2006/0180851 | A1 | 8/2006 | Lee et al. |
| 2007/0158736 | A1 | 7/2007 | Arai et al. |
| 2007/0252201 | A1 | 11/2007 | Kito et al. |
| 2008/0067583 | A1 | 3/2008 | Kidoh et al. |
| 2008/0089105 | A1 | 4/2008 | Ro et al. |
| 2008/0113479 | A1 * | 5/2008 | Mokhlesi ...................... 438/266 |
| 2010/0320433 | A1 | 12/2010 | Ro et al. |

FOREIGN PATENT DOCUMENTS

| | | |
|---|---|---|
| JP | 2007-180389 | 7/2007 |
| KR | 10-0772904 B1 | 11/2007 |

OTHER PUBLICATIONS

Y. Fukuzumi et al., "Optimal Integration and Characteristics of Vertical Array Devices for Ultra High Density, Bit-Cost Scalable Flash Memory", IEDM Tech. Dig., pp. 449-452 (2007).

* cited by examiner

Fig. 9

| L | S1 | S2 | S3 | S4 | S5 | S6 | L | S1 | S2 | S3 | S4 | S5 | S6 |
|---|---|---|---|---|---|---|---|---|---|---|---|---|---|
| 1 | | | | | | | 33 | 32 | | | | | |
| 2 | | | | | | 1 | 34 | 32 | | | | | 1 |
| 3 | | | | | 2 | | 35 | 32 | | | | 2 | |
| 4 | | | | | 2 | 1 | 36 | 32 | | | | 2 | 1 |
| 5 | | | | 4 | | | 37 | 32 | | | 4 | | |
| 6 | | | | 4 | | 1 | 38 | 32 | | | 4 | | 1 |
| 7 | | | | 4 | 2 | | 39 | 32 | | | 4 | 2 | |
| 8 | | | | 4 | 2 | 1 | 40 | 32 | | | 4 | 2 | 1 |
| 9 | | | 8 | | | | 41 | 32 | | 8 | | | |
| 10 | | | 8 | | | 1 | 42 | 32 | | 8 | | | 1 |
| 11 | | | 8 | | 2 | | 43 | 32 | | 8 | | 2 | |
| 12 | | | 8 | | 2 | 1 | 44 | 32 | | 8 | | 2 | 1 |
| 13 | | | 8 | 4 | | | 45 | 32 | | 8 | 4 | | |
| 14 | | | 8 | 4 | | 1 | 46 | 32 | | 8 | 4 | | 1 |
| 15 | | | 8 | 4 | 2 | | 47 | 32 | | 8 | 4 | 2 | |
| 16 | | | 8 | 4 | 2 | 1 | 48 | 32 | | 8 | 4 | 2 | 1 |
| 17 | | 16 | | | | | 49 | 32 | 16 | | | | |
| 18 | | 16 | | | | 1 | 50 | 32 | 16 | | | | 1 |
| 19 | | 16 | | | 2 | | 51 | 32 | 16 | | | 2 | |
| 20 | | 16 | | | 2 | 1 | 52 | 32 | 16 | | | 2 | 1 |
| 21 | | 16 | | 4 | | | 53 | 32 | 16 | | 4 | | |
| 22 | | 16 | | 4 | | 1 | 54 | 32 | 16 | | 4 | | 1 |
| 23 | | 16 | | 4 | 2 | | 55 | 32 | 16 | | 4 | 2 | |
| 24 | | 16 | | 4 | 2 | 1 | 56 | 32 | 16 | | 4 | 2 | 1 |
| 25 | | 16 | 8 | | | | 57 | 32 | 16 | 8 | | | |
| 26 | | 16 | 8 | | | 1 | 58 | 32 | 16 | 8 | | | 1 |
| 27 | | 16 | 8 | | 2 | | 59 | 32 | 16 | 8 | | 2 | |
| 28 | | 16 | 8 | | 2 | 1 | 60 | 32 | 16 | 8 | | 2 | 1 |
| 29 | | 16 | 8 | 4 | | | 61 | 32 | 16 | 8 | 4 | | |
| 30 | | 16 | 8 | 4 | | 1 | 62 | 32 | 16 | 8 | 4 | | 1 |
| 31 | | 16 | 8 | 4 | 2 | | 63 | 32 | 16 | 8 | 4 | 2 | |
| 32 | | 16 | 8 | 4 | 2 | 1 | 64 | 32 | 16 | 8 | 4 | 2 | 1 |

| L | S1 | S2 | S3 | S4 | S5 | S6 |
|---|----|----|----|----|----|----|
| 1 | | | | | | |
| 2 | | | | | | 1 |
| 3 | | | | | 2 | |
| 4 | | | | | 2 | 1 |
| 5 | | | | 4 | | |
| 6 | | | | 4 | | 1 |
| 7 | | | | 4 | 2 | |
| 8 | | | | 4 | 2 | 1 |
| 9 | | | 8 | | | |
| 10 | | | 8 | | | 1 |
| 11 | | | 8 | | 2 | |
| 12 | | | 8 | | 2 | 1 |
| 13 | | | 8 | 4 | | |
| 14 | | | 8 | 4 | | 1 |
| 15 | | | 8 | 4 | 2 | |
| 16 | | | 8 | 4 | 2 | 1 |

| L | S1 | S2 | S3 | S4 | S5 | S6 |
|---|----|----|----|----|----|----|
| 1 | | | | | | |
| 2 | | | | | | 1 |
| 3 | | | | | 2 | |
| 4 | | | | | 2 | 1 |
| 5 | | | | 4 | | |
| 6 | | | | 4 | | 1 |
| 7 | | | | 4 | 2 | |
| 8 | | | | 4 | 2 | 1 |
| 9 | | | 8 | | | |
| 10 | | | 8 | | | 1 |
| 11 | | | 8 | | 2 | |
| 12 | | | 8 | | 2 | 1 |
| 13 | | | 8 | 4 | | |
| 14 | | | 8 | 4 | | 1 |
| 15 | | | 8 | 4 | 2 | |
| 16 | | | 8 | 4 | 2 | 1 |

| L | S1 | S2 | S3 | S4 | S5 | S6 |
|---|----|----|----|----|----|----|
| 1 | | | | | | |
| 2 | | | | | | 1 |
| 3 | | | | | 2 | |
| 4 | | | | | 2 | 1 |
| 5 | | | | 4 | | |
| 6 | | | | 4 | | 1 |
| 7 | | | | 4 | 2 | |
| 8 | | | | 4 | 2 | 1 |
| 9 | | | 8 | | | |
| 10 | | | 8 | | | 1 |
| 11 | | | 8 | | 2 | |
| 12 | | | 8 | | 2 | 1 |
| 13 | | | 8 | 4 | | |
| 14 | | | 8 | 4 | | 1 |
| 15 | | | 8 | 4 | 2 | |
| 16 | | | 8 | 4 | 2 | 1 |

| L | S1 | S2 | S3 | S4 | S5 | S6 |
|---|----|----|----|----|----|----|
| 1 |  |  |  |  |  |  |
| 2 |  |  |  |  |  | 1 |
| 3 |  |  |  |  | 2 |  |
| 4 |  |  |  |  | 2 | 1 |
| 5 |  |  |  | 4 |  |  |
| 6 |  |  |  | 4 |  | 1 |
| 7 |  |  |  | 4 | 2 |  |
| 8 |  |  |  | 4 | 2 | 1 |
| 9 |  |  | 8 |  |  |  |
| 10 |  |  | 8 |  |  | 1 |
| 11 |  |  | 8 |  | 2 |  |
| 12 |  |  | 8 |  | 2 | 1 |
| 13 |  |  | 8 | 4 |  |  |
| 14 |  |  | 8 | 4 |  | 1 |
| 15 |  |  | 8 | 4 | 2 |  |
| 16 |  |  | 8 | 4 | 2 | 1 |

US 8,971,118 B2

METHODS OF FORMING NON-VOLATILE MEMORY DEVICES INCLUDING VERTICAL NAND STRINGS

CROSS-REFERENCE TO RELATED APPLICATION

This application is a continuation of U.S. patent application Ser. No. 13/692,334, filed Dec. 3, 2012 which is a continuation of U.S. patent application Ser. No. 12/480,399 filed Jun. 8, 2009, now U.S. Pat. No. 8,325,527, which claims priority to Korean Patent Application 10-2008-0054710, filed in the Korean Intellectual Property Office on Jun. 11, 2008, the disclosures of which are incorporated by reference herein in their entireties.

FIELD

The present inventive concept relates to the field of semiconductors in general, and more particularly, to method of forming semiconductor devices.

BACKGROUND

Vertical NAND string configurations have been used to increase the density of non-volatile memories. One such vertical NAND string structure is discussed in, "Bit Cost Scalable Technology With Punch and Plug Process For Ultra High Density Flash Memory," by H. Tanaka et al. in Symp. On VLSI Tech. Dig., pp 14~15(2007). Other approaches are discussed in, for example, Optimal Integration and Characteristics of Vertical Array Devices for Ultra High Density, Bit-Cost Scalable Flash Memory by Y. Fukuzumi et al. in IEDM Tech. Dig., pp-449-452 (2007); US Patent Publication No. US2007/0252201 A1 to Kito et al.; U.S. Pat. No. 6,858,906; No. 7,253,467; No. 7,315,474 and US Patent Publication No. 2006/0180851, the disclosures of which are incorporated herein in their entireties.

SUMMARY

Embodiments according to the inventive concept, can provide non-volatile memory devices including vertical nand strings and methods of forming the same. Pursuant to these embodiments, a NAND based non-volatile memory device can include a plurality of memory cells vertically arranged as a NAND string and a plurality of word line plates each electrically connected to a respective gate of the memory cells in the NAND string. A plurality of word line contacts can each be electrically connected to a respective word line plate, where the plurality of word line contacts are aligned to a bit line direction in the device.

In some embodiments according to the invention, a method of forming a NAND based non-volatile memory device can include forming a plurality of word line contacts electrically coupled to a plurality of memory cells vertically arranged as a NAND string, where each of word line contacts is electrically connected to a respective one of a plurality of word line plates, where the plurality of word line contacts are aligned to a bit line direction in the device.

BRIEF DESCRIPTION OF THE DRAWINGS

FIG. 9 is the table that illustrates steps in forming contact portions of word line plates included in vertical NAND strings of non-volatile memory devices in some embodiments according to the invention.

DESCRIPTION OF EMBODIMENTS ACCORDING TO THE INVENTIVE CONCEPT

Figure 1:
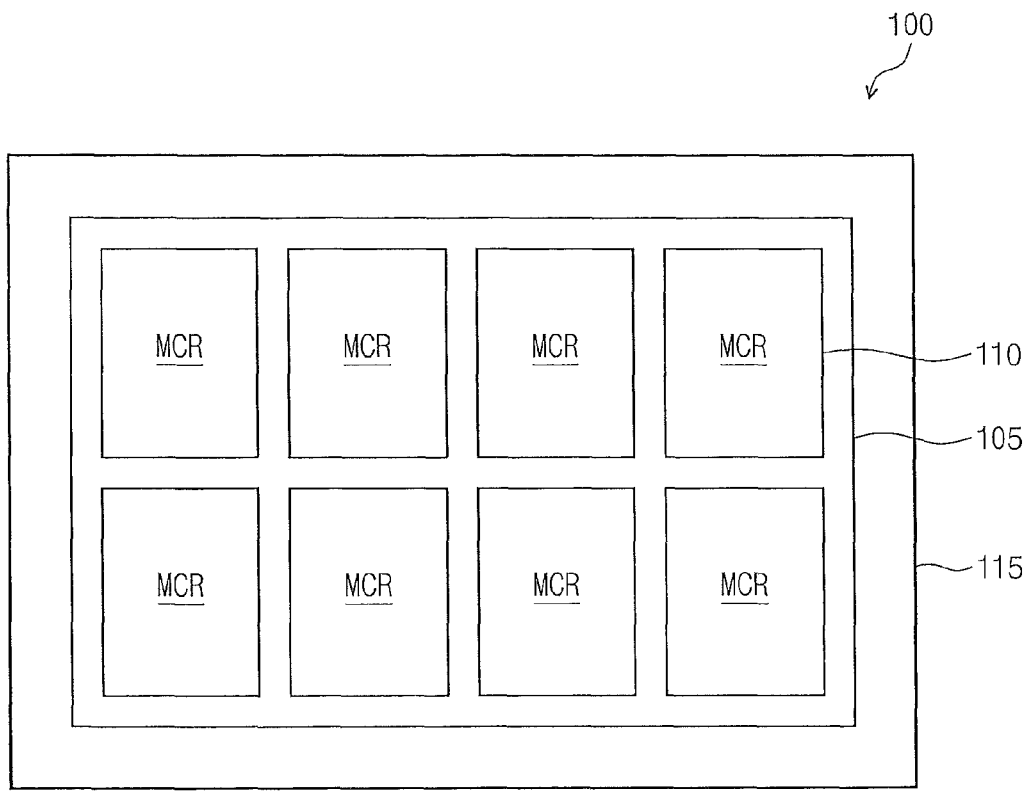
FIGS. 1-4 are plan views of integrated circuit layouts including cell array regions containing memory cell regions both surrounded by a peripheral region in some embodiments according to the invention.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
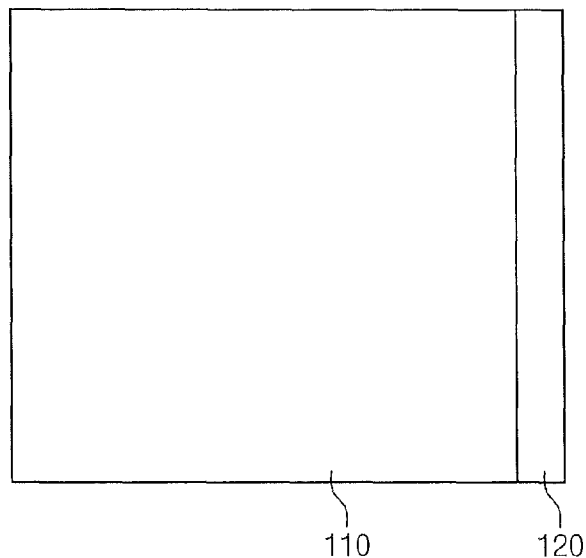
Figure 3:
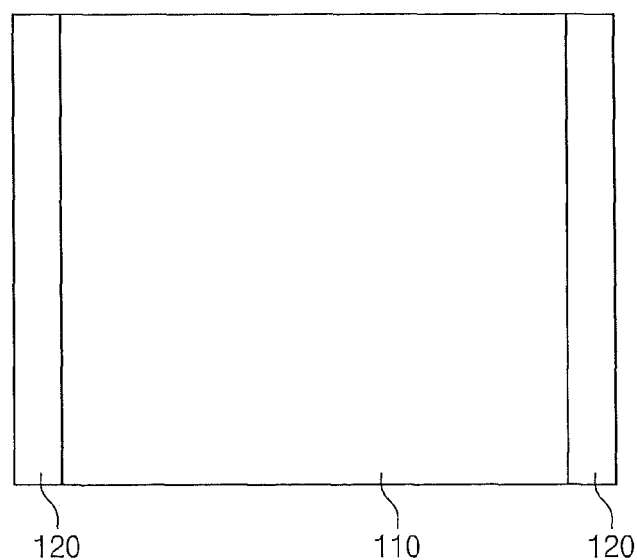
Figure 4:
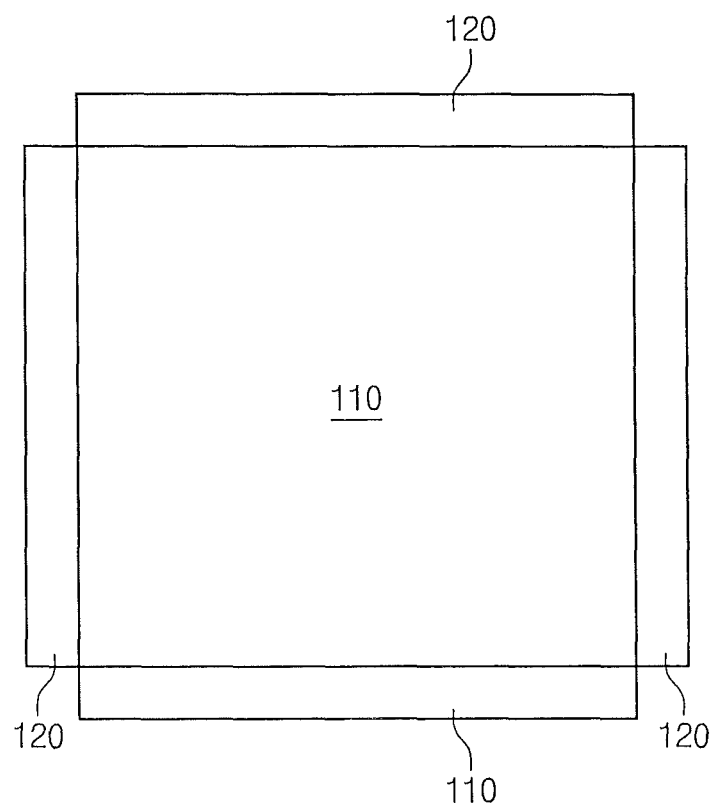

FIG. 1 is a plan view illustrating a semiconductor device 100 including a plurality of memory cell regions 110 included in a cell array region 105 surround by a peripheral region 115. According to FIGS. 2-4, each of the memory cell regions 110 can include a contact region 120 located in any of the positions illustrated by FIGS. 2-4. For example, FIG. 2 shows that a contact region 120 is located along a single edge of the memory cell region 110. Alternatively, FIG. 3 illustrates that contact regions 120 can be located along two opposing edges of the memory cell region 110. Finally, FIG. 4 illustrates that contact regions 120 can be located along each of the edges of the memory cell region 110. Accordingly, contact portions of the word line plates included in vertical NAND strings described herein can be located within the contact regions 120 shown in FIGS. 2-4.

Figure 5A:
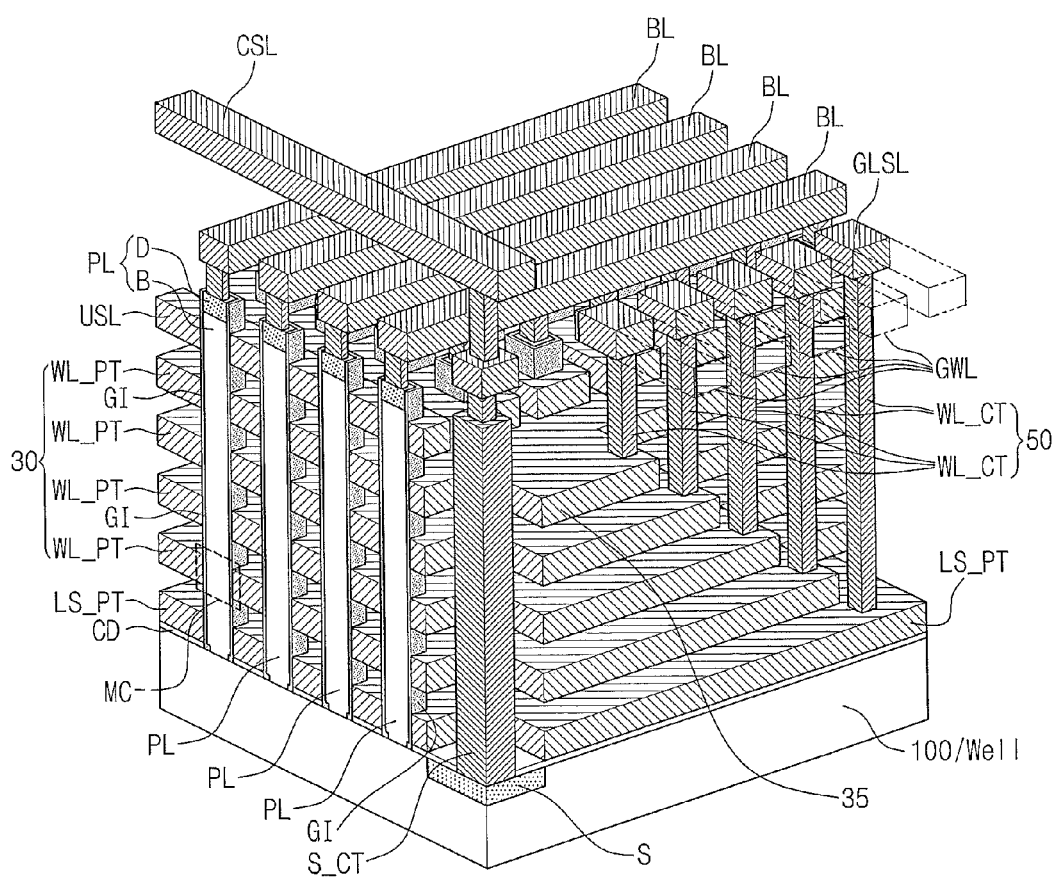
FIGS. 5A-5C are different views of vertical NAND strings in a non-volatile memory device in some embodiments according to the invention.
Figure 5B:
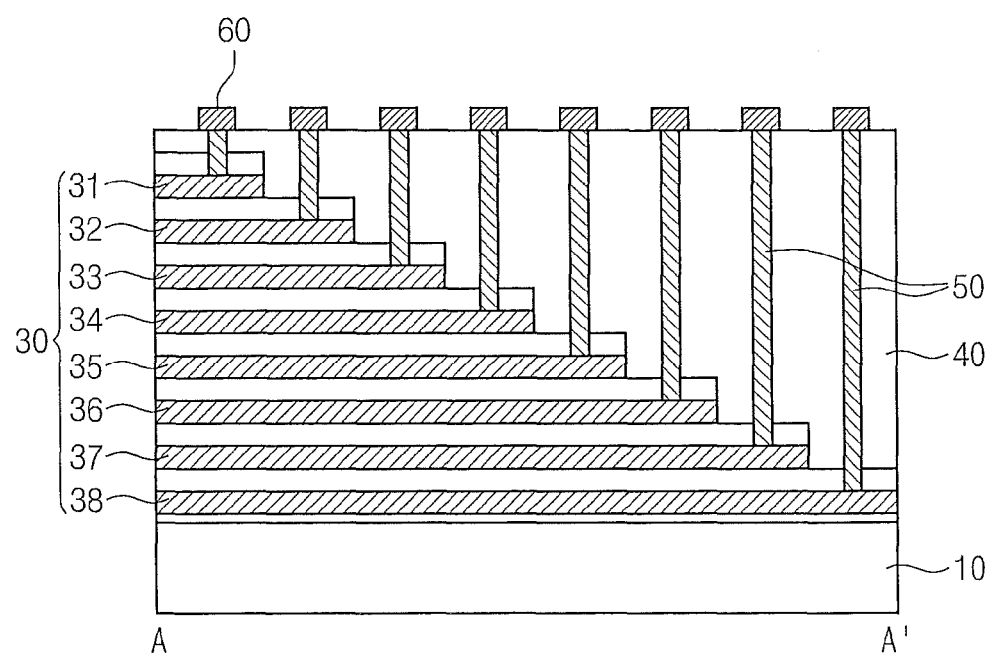
Figure 5C:
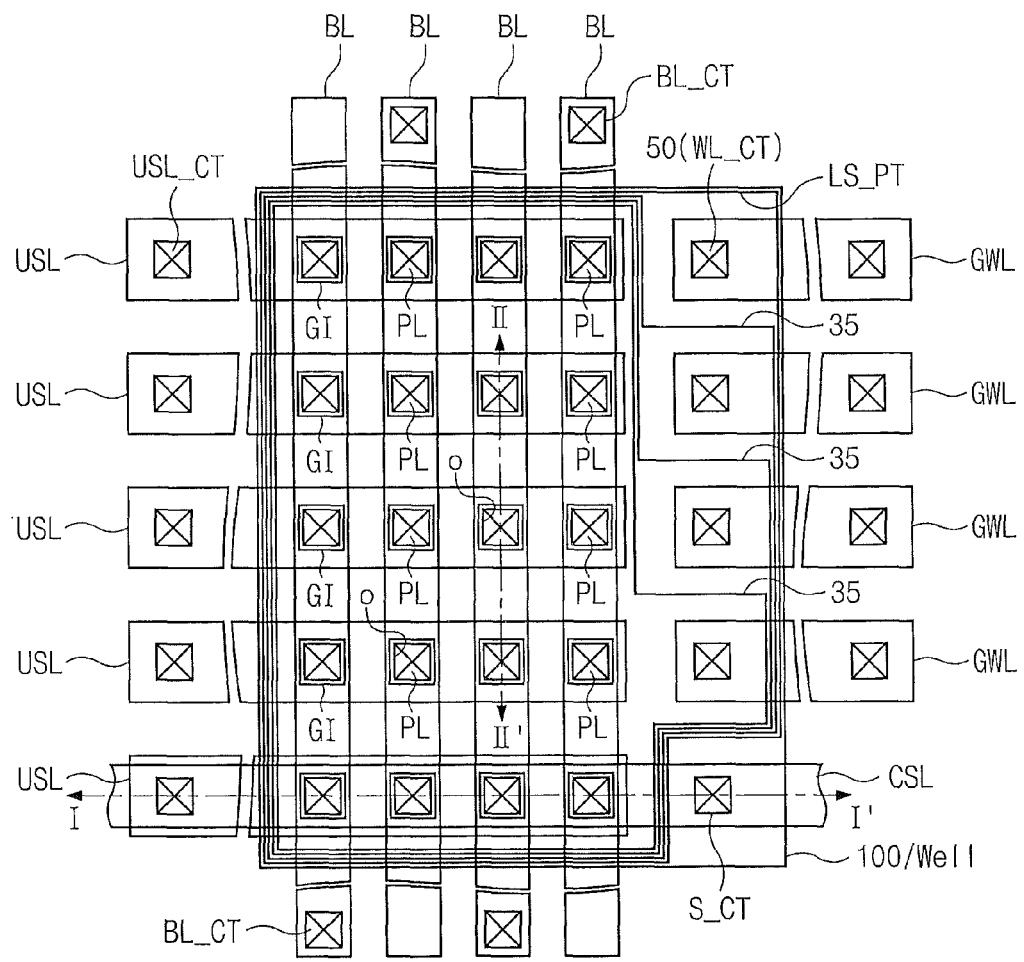

FIGS. 5A-C are different views illustrating contact portions 35 of word line plates 30 included in a vertical NAND string of the semiconductor device 100. In particular, FIG. 5A illustrates a perspective view of the vertical NAND string configuration where each of the word line plates 30 (WL_PT) is electrically coupled to one of the memory cells included in the vertical NAND string located between an upper select line (USL) and a lower selection plate (LS_PT). It will be understood that the upper select line USL can provide a similar function to that of a string select line in a NAND string device. Accordingly, each of the vertical NAND strings illustrated in FIG. 5A includes a plurality of memory cells MC oriented along the vertical direction followed by the pillar PL.

It will be further understood that each of the word line plates 30 is electrically coupled to the gate electrodes of each of the memory cells in each of the immediately adjacent vertical NAND strings. For example, the upper most word line 30 is shown in FIG. 5A as being coupled to an exemplary number of vertical NAND strings 1-4 shown in positions extending from right most pillar PL to the left most pillar PL. Accordingly, the upper most word line plate 30 is electrically coupled to the gate electrode corresponding to the upper most memory cell MC in each of the immediately adjacent vertical NAND strings 1-4. Furthermore, the plurality of word line plates 30 are vertically spaced apart from one another so that each of the memory cells MC in the vertical NAND string is electrically coupled to a corresponding word line plate 30 so that each particular memory cell MC can be controlled by a corresponding respective word line plate 30.

As further shown in FIG. 5A, the vertical NAND strings are positioned beneath a plurality of corresponding bit lines BL extending in a first direction in the semiconductor device 100. Furthermore, a column select line CSL extends in a second direction that is perpendicular to the first direction of the bit lines in the semiconductor device 100 and is electrically connected to a source contact S_CT that extends downward alongside the vertical NAND string. Furthermore, a plurality of global word lines 60 GWL extends in a direction that is perpendicular to the bit lines BL and electrically contact a plurality of word line contacts 50 (WL_CT) that extend downward into the vertical NAND string.

As further shown in FIG. 5A, each of the word line contacts 50 electrically contacts a corresponding contact portion of a respective word line plate 35 so that the contact portions of each of the word line plates 35 defines a stair-step structure that extends downward into the vertical NAND string. Furthermore, the word line contacts 50 are aligned to one another and to the direction in which the bit lines BL extend in the semiconductor device 100.

As further illustrated by FIG. 5A, each of the pillars PL can include a drain region as well as body region and the lower selection plate LS_PT is formed on the capacitor dielectric CD located on the substrate (formed to have an orientation 100). Further, a gate insulator film (GI) can extend as shown from the lower selection plate LS_PT to the upper selection line (USL). FIGS. 5B and 5C illustrate a cross sectional view and a plan view of the vertical mass structure illustrated in FIG. 5A.

As further shown in FIG. 5A, each of the contact portions 35 of the respective word line plates 30, to which it is connected, protrudes from a majority of the word line plate 30 to provide for contact by the respective word line contact 50. Furthermore, portions of the word line plate 30 located behind the word line contacts 50 define a word line plate sidewall that faces in the direction of the global word line. The size of the word line plate sidewall facing the global word line direction decreases as the stair step pattern of the contact portions extends downward. For example, the portion of the word line plate sidewall adjacent to the lowest most word line plate 30 is smaller than any of the other portions of the word line plate side wall located above it. Furthermore, the same can be said of any of the portions of the word line plate sidewall defined by a corresponding word line plate 30. It will be further understood that the contact portion 35 and the word line plate 30 comprises a homogeneous unitary structure such that there is no division in formation between the word line plate 30 and the portion of the word line plate 30 that protrudes to define the word line plate contact portion 35 in some embodiments according to the invention.

As further shown in FIG. 5A, each of the contact portions 35 associated with a respective word line plate 30 is uncovered by all of the contact portions 35 located above. Furthermore, an uncovered portion of the contact portion 35 is uncovered by an amount that is sufficient to allow the respective word line contact 50 electrically contacting therewith to avoid contact with any other of the word line contact portions within the stair step pattern. The word line plate sidewall terminates the uncovered contact portion in the global word line direction. In some embodiments according to the invention, the word line contacts 50 are spaced apart from the portions of the word line plates 50 that define the sidewall by an equal distance.

Figure 6A:
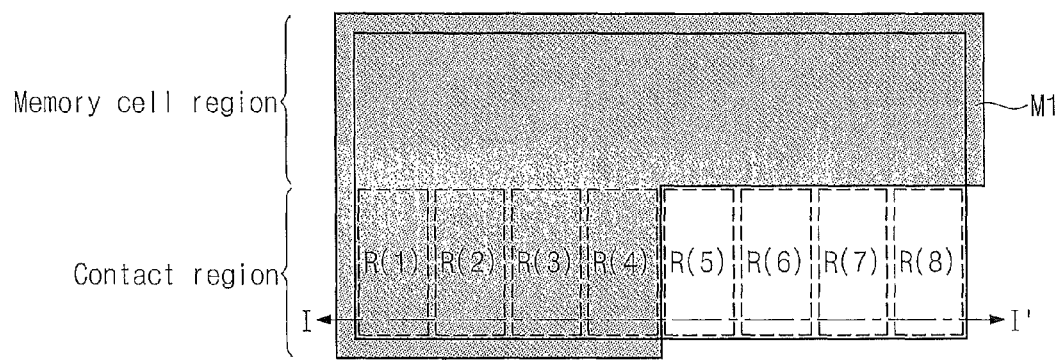
FIGS. 6A-8B are plan and cross sectional views illustrating methods of forming contact portions of word line plates included in vertical NAND strings in some embodiments according to the invention.
Figure 6B:
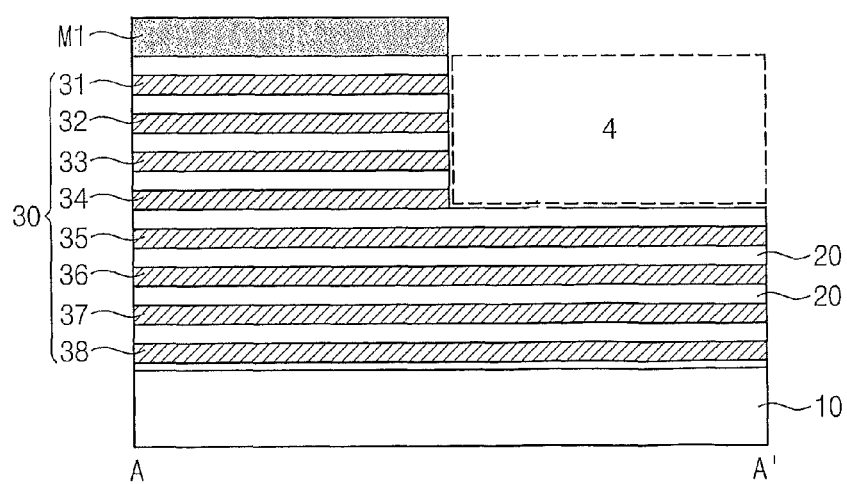
Figure 7A:
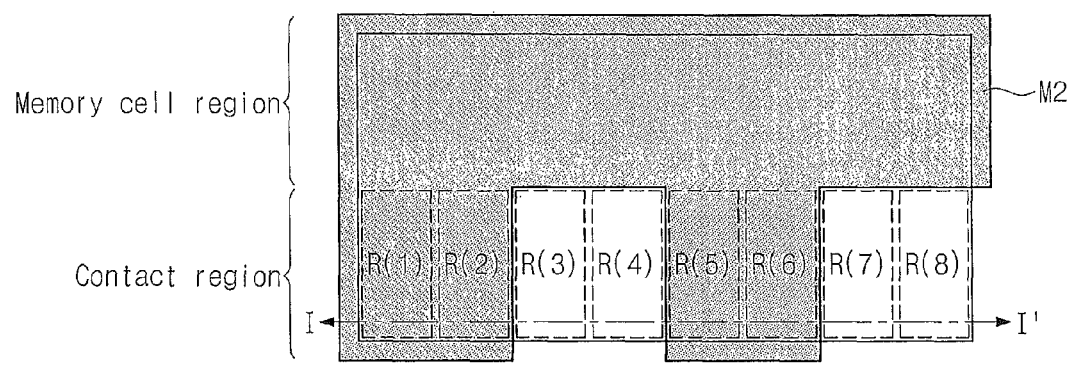
Figure 7B:
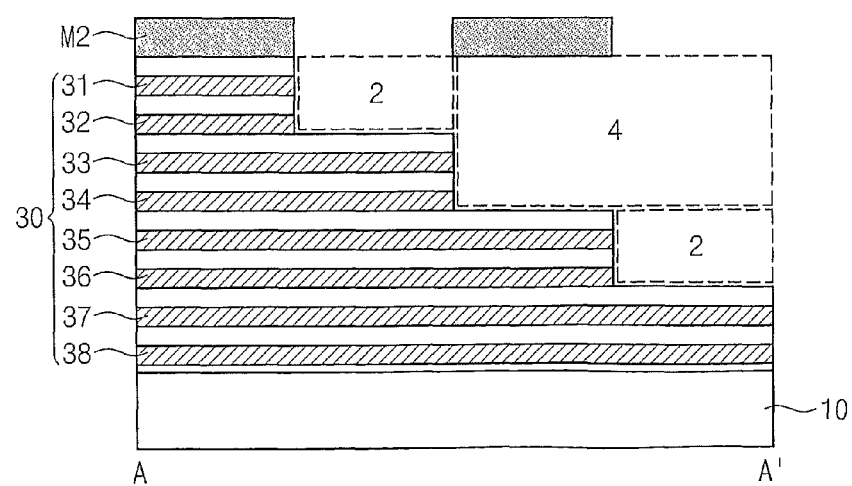
Figure 8A:
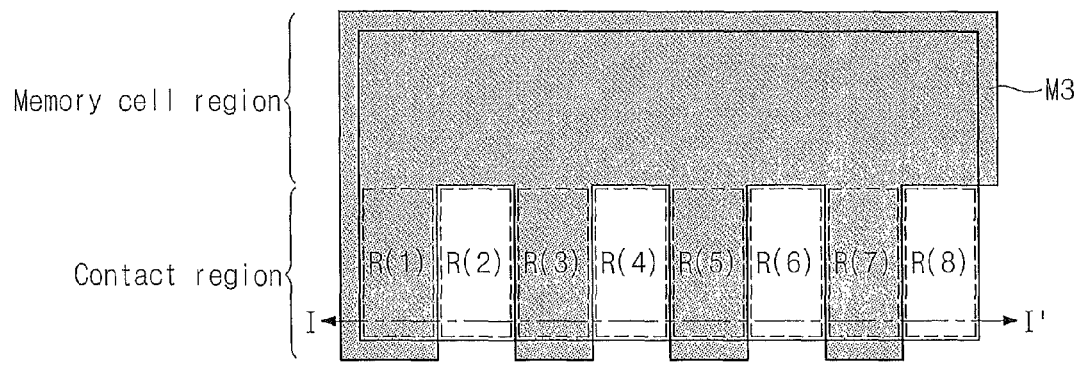
Figure 8B:
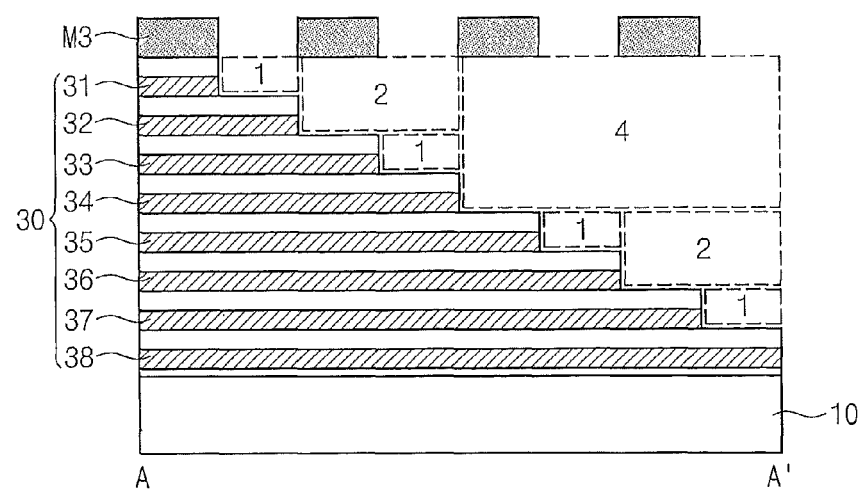

FIGS. 6A-8B show various plan and cross sectional views illustrating the formation of contact portions of word line plates included in vertical NAND strings of semiconductor memory devices in some embodiments according to the invention. In particular, FIGS. 6A and 6B show a first stack in the formation of contact portion of word line plates in a vertical NAND string where a first mask M1 is formed on a sequence of eight word line layers 31-38 (referred to collectively as 30) separated by a series of interlayer dielectric layers 20 all of which are located on a substrate 10. It will be understood that the FIGS. 6B, 7B, and 8B are cross sectional views taken along line I-I' shown in FIGS. 6A, 7A, and 8A.

According to FIG. 6B, the first mask M1 is used to etch the four upper most word line plate layers 31-34 (and the intervening interlayer dielectric layers 20) while keeping the four lower most word line plate layers 35-38 intact. As shown in FIG. 6A the mask M1 covers half of the contact portions (designated as R(1) to R(4) of R(1) to R(8)) and exposes the remaining number of contact portions of the word line plates.

According to FIGS. 7A and 7B, the first mask M1 is removed and a second mask M2 is formed thereon. As shown in FIG. 7A, the second mask M2 covers half of the contact portions which were covered by the first mask M1 in FIG. 6A and, further, the mask M2 also covers half of the contact portions R5-R8 which were left exposed by the first mask M1 in FIG. 6A.

As illustrated by FIG. 7B, the second mask M2 is used to etch half of the remaining layers which were exposed by the first mask M1 corresponding to contact portions R5-R8. For example, according to FIG. 7B, two of the four word line plate layers 35-38 are etched using the second mask M2 so as to leave the two lower most word line plate layers 37 and 38 intact. Furthermore, the second mask M2 is also used to remove word line plate layers exposed by the second mask M2 which were also covered by the first mask M1 in FIG. 6A. Accordingly, the two upper most word line plate layers 31 and 32 are also removed while word line plate layers 35 and 36 are removed using the second mask M2.

According to FIGS. 8A and 8B, the second mask M2 is removed and a third mask M3 is formed in its place. According to FIG. 8A, the third mask M3 is formed to cover half the contact portions of the underlying word line plates which were covered by the second mask M2 and which were also exposed by the second mask M2. In particular, the third mask M3 covers R1 and R5 both of which were covered by the second mask M2 and covers contact portions R3 and R7 both of which were left exposed by the second mask M2.

According to FIG. 8B, the third mask M3 is used to etch half the number of word line plate layers 30 which were left intact after the etching step outlined in FIGS. 7A and 7B. In particular, the third mask M3 is used to etch the remaining word line plate layer 37 so as to leave the word line plate layer 38 as the only remaining word line plate layer left intact at contact portion R(8). Furthermore, the third mask M3 is also used to etch a single word line plate layer 30 and each of the contact portions left exposed by the third mask M3. In particular, the third mask M3 is used to etch a single exposed portion of a word line plate layer 30 corresponding to contact portions R2, R4, and R6 each of which are left exposed by the third mask M3. Therefore, the sequential application of the three masks M1, M2, and M3 as outlined above provides the formation of the eight contact portions R1-R8 arranged in a stair step pattern extending downward in the direction of the bit line in the non-volatile memory device.

FIG. 9 is a table that illustrates the formation of a plurality of word line contact portions of word line plates including a vertical NAND string in some embodiments according to the invention. In particular, FIG. 9 illustrates the formation of 64 word line contact portions of the vertical NAND string as an exemplary embodiment. Accordingly, the columns labeled L represent the specific layer in which the word line contact portion is to be formed. The columns labeled 1-6 specified mask and etch steps that are used to form the 64 contact portions.

The numbers located in the columns and rows of the table indicate the number of underlying layers that are to be removed at the respective contact portion. For example, in a first step (shown by the column labeled 1) a mask is formed to cover all of the underlying layers at positions that correspond to contact portions 32-63 whereas locations that correspond to contact portions 1-32 are left uncovered by the first mask. Furthermore, the number 32 specified in the column labeled 1 indicates that 32 of the underlying word line plate layers are to be removed during the first etching step. In other words, during the first etching step, 32 of the 64 underlying layers will be removed. During the second etching step (in the column labeled S2) a mask is formed to cover locations corresponding to contact portions 17-32 and to cover contact portions corresponding to 49-64. Locations corresponding to contact portions 1-16 and 33-48 are left uncovered. During etching for this step, 16 of the underlying layers (of the remaining 32) are removed.

Figures 10, 11:
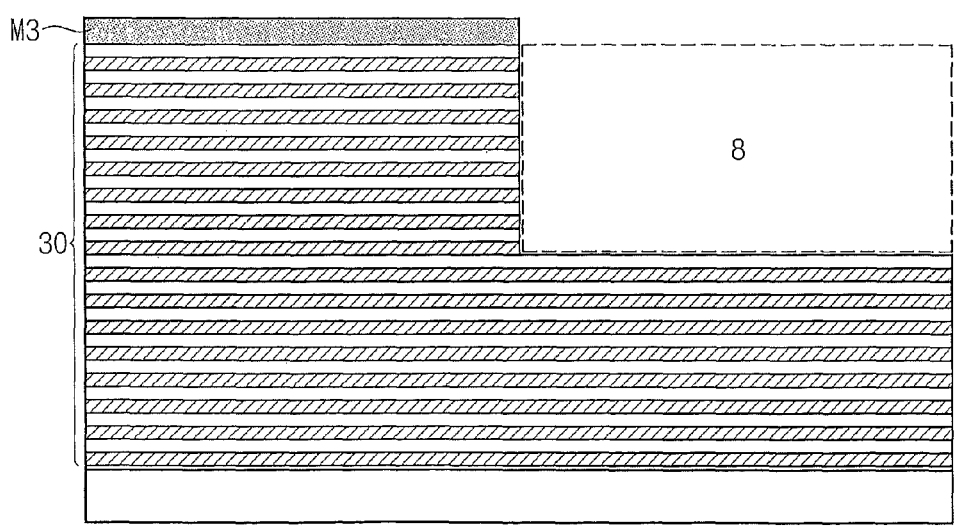
FIGS. 10, 12, 14, and 16 are tables showing sub-sections of the table illustrated in FIG. 9 illustrating steps in forming contact portions of vertical NAND strings in non-volatile memory devices in some embodiments according to the invention.
FIGS. 11, 13, 15 and 17 are cross sectional views of word line plate layers subject to etching using mask layers to provide for the formation of contact portions of the word line plates included in vertical NAND strings in non-volatile memory devices in some embodiments according to the invention.

FIGS. 10-17 are figures that illustrate further details regarding the embodiment illustrated in FIG. 9. For example, the table illustrated in FIG. 10 shows a subset of the entries of the table in FIG. 9, reflecting that during a third step a mask is formed on the word plate layers to cover locations corresponding to contact portions 9-16. Subsequently, the etching associated with step three is performed to remove 8 of the underlying layers exposed by the mask. For example, as shown in FIG. 11, the 8 upper most layers 30 left exposed by the mask M3 are removed so that the lower most 8 layers remain intact and such that the layers protected by the mask layer M3 are not etched.

Figures 12, 13:
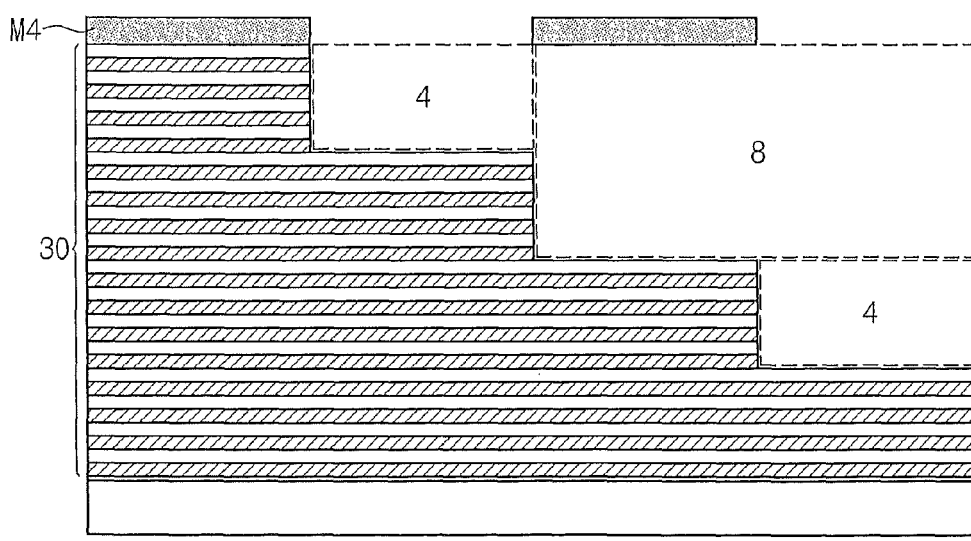
Figures 14, 15:
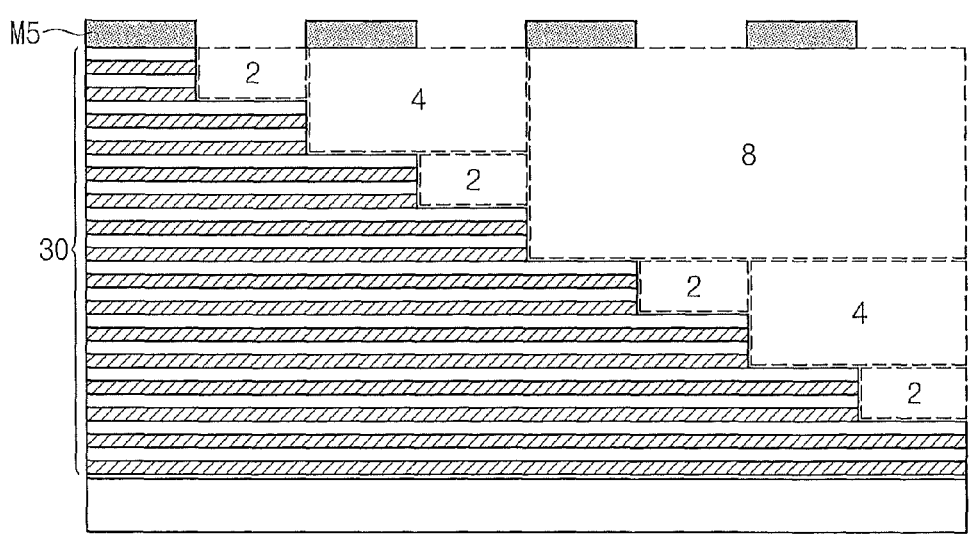

In a step 4 illustrated by FIGS. 12 and 13, mask M4 is formed to cover portions of the layers 30 corresponding to contact portions 5-8 and 13-16 whereupon four of the layers exposed by the mask M4 are removed as shown in FIG. 13. According to a step 5 illustrated in FIGS. 14 and 15, a mask M5 is formed to cover the layers 30 at positions corresponding to contact portions 1-4, 7-8, 11-12, and 15-16 as shown in FIG. 15. During the etching step, two of the exposed layers 30 are removed as shown in FIG. 15.

Figures 16, 17:
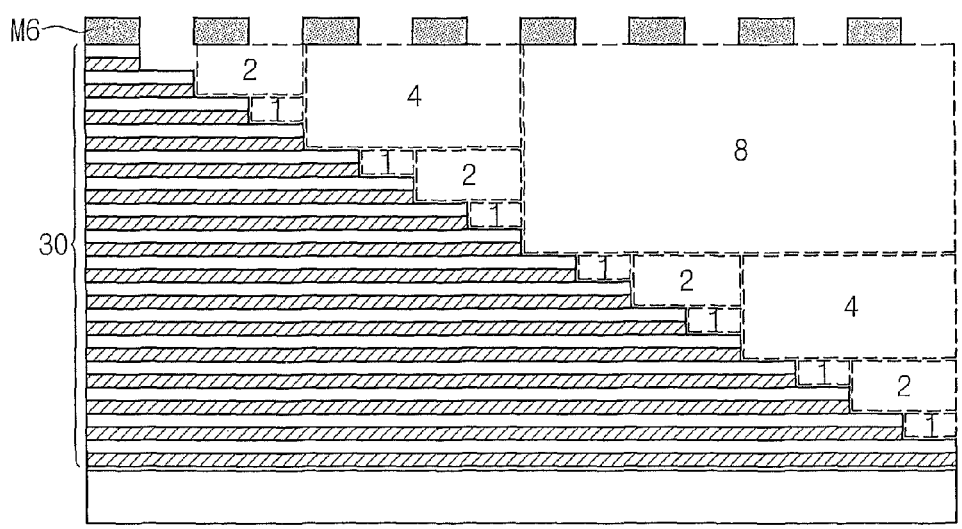

In a sixth step as illustrated in FIGS. 16 and 17, a mask M6 is formed on the layers 30 to cover locations therein corresponding to contact portions 2, 4, 6, 8, 10, 12, 14, and 16 as shown in FIG. 17. During the etching using the mask M6, a single one of the exposed layers is removed to provide the stair step pattern shown in FIG. 17, which extends downward in the direction of the bit line in the non-volatile memory device.

Figure 18:
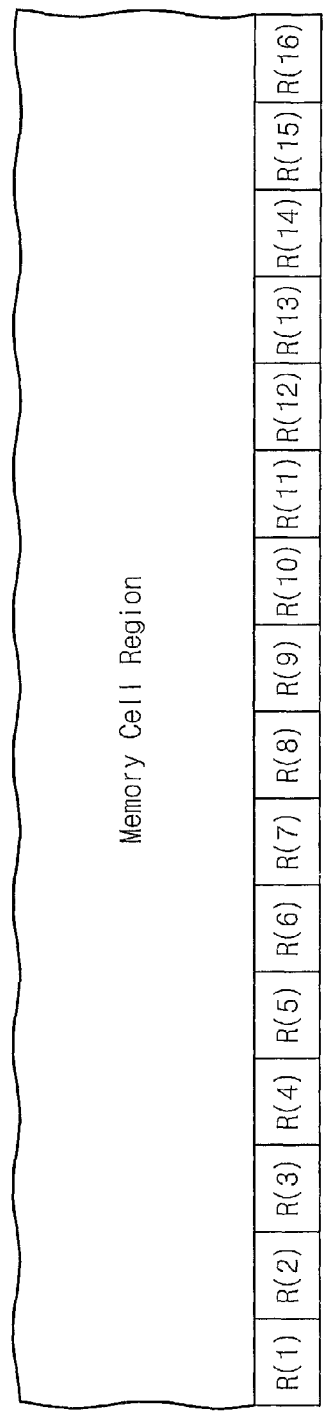
FIG. 18 is a table that further illustrates the formation of the vertical NAND strings including contact portions of word line plates included in non-volatile memory devices in some embodiments according to the invention.
Figure 19:
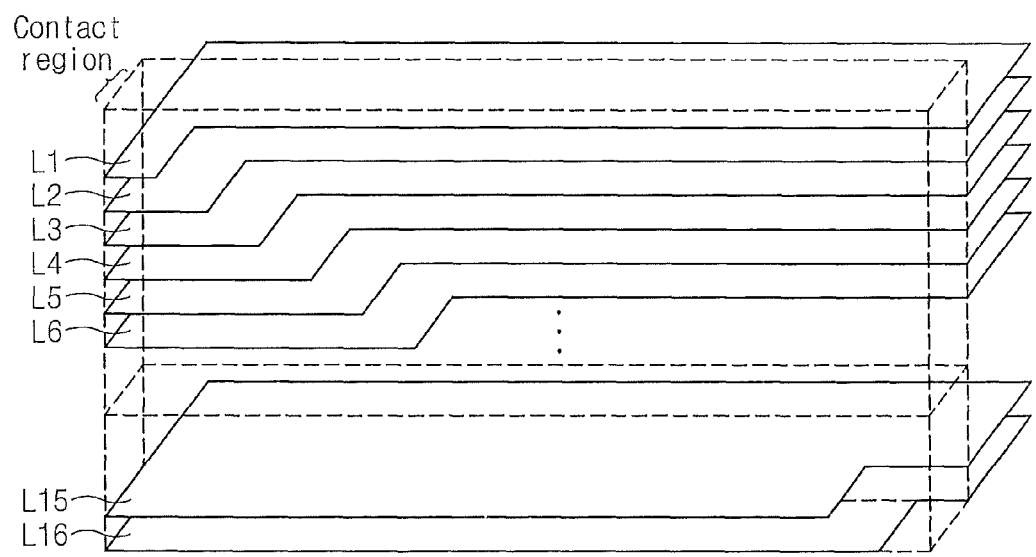
FIG. 19 is a perspective view showing contact portions including different layers of word line plates of vertical NAND strings of non-volatile memory devices formed according to the steps illustrated in FIG. 18, in some embodiments according to the invention.

FIGS. 18 and 19 provide further illustrations of the formation of contact portions of a NAND string non-volatile memory device in some embodiments according to the invention. In particular, FIG. 18 is a table that illustrates the formation of 16 contact portions of the word line plates within the contact region adjacent to the memory cell region MCR. According to FIG. 18, a first step in forming the 16 contact portions includes the removal of 8 of the upper most layers corresponding to contact portions R9-R16. Second, the etching is performed at locations corresponding to contact portions R1-R4 and R9-R12. During a third step, etching is performed corresponding to locations for contact portions R1, R2, R5, R6, R9, R10, R13, and R14. During a fourth step, the etching is performed at locations corresponding to contact portions R1, R3, R5, R7, R9, R11, R13, and R15 to provide the 16 contact portions of the word line plates as illustrated, for example, in FIG. 19.

Figure 20:
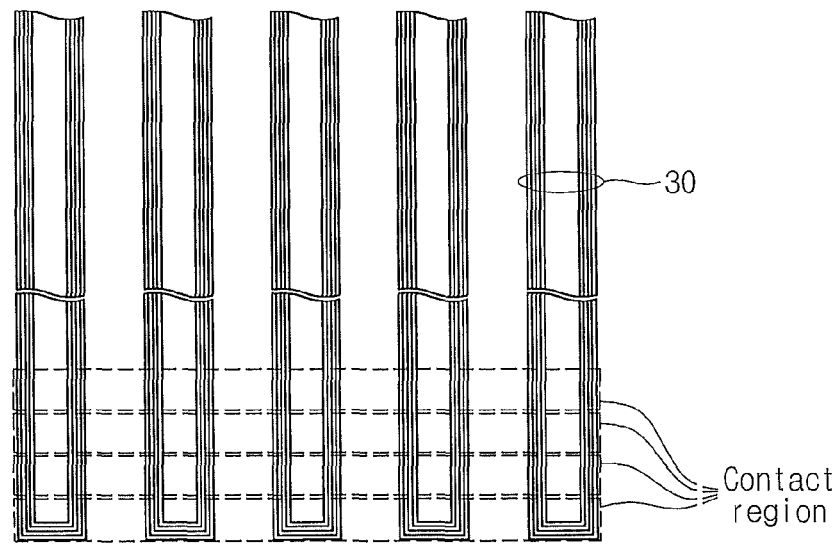
FIGS. 20 and 21 are plan views that illustrate the formation of a line and space pattern including contact portions in some embodiments according to the invention.

FIG. 20 is a plan view that illustrates the formation of contact portions 35 according to a line and space pattern in some embodiments according to the invention. In particular, a conductive line 30 can be formed to have contact portions 35 within the contact region that have a stair step pattern as described herein.

Figure 21:
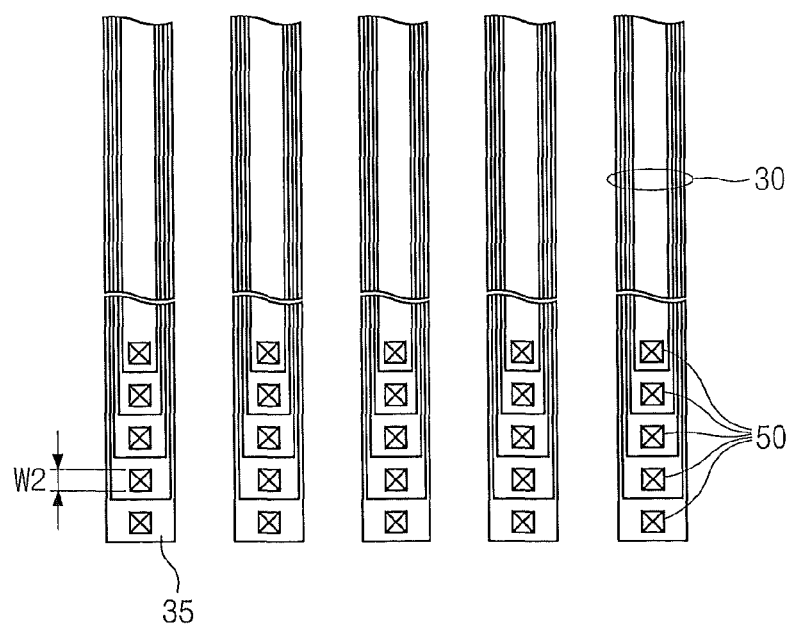

As shown in FIG. 21, the contact portions 35 within the contact region can include contacts 50, which electrically contact each of the contact portions 35. Furthermore, the conductive lines 30 include a sidewall portion defined by each of the sidewalls of the conductive lines 30, which make up the stair step pattern including the contact portions 35.

Figure 22:
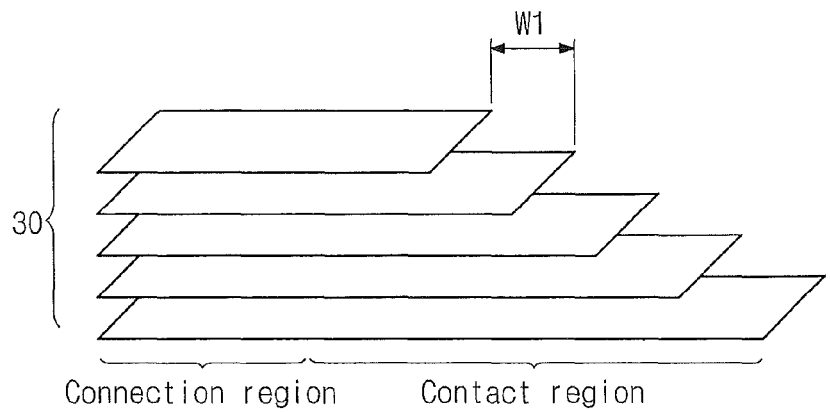
FIG. 22 is a perspective view illustrating the contact portions of a line and space pattern shown in FIGS. 20 and 21, in some embodiments according to the invention.

According to FIG. 22, the stair step pattern can be formed such that the contact portions within the contact region have varying widths W1. For example, according to FIG. 22, the word line plates 30 can include the contact portions within the contact region so that any number of the contact portions associated with the word line plates 30 can have a width that is different from the other widths associated with the other contact portions. Furthermore, the width W1 for each of the contact portions is greater than a width W2 of the contacts 50, which electrically contact each of the contact portions 35.

Figure 23:
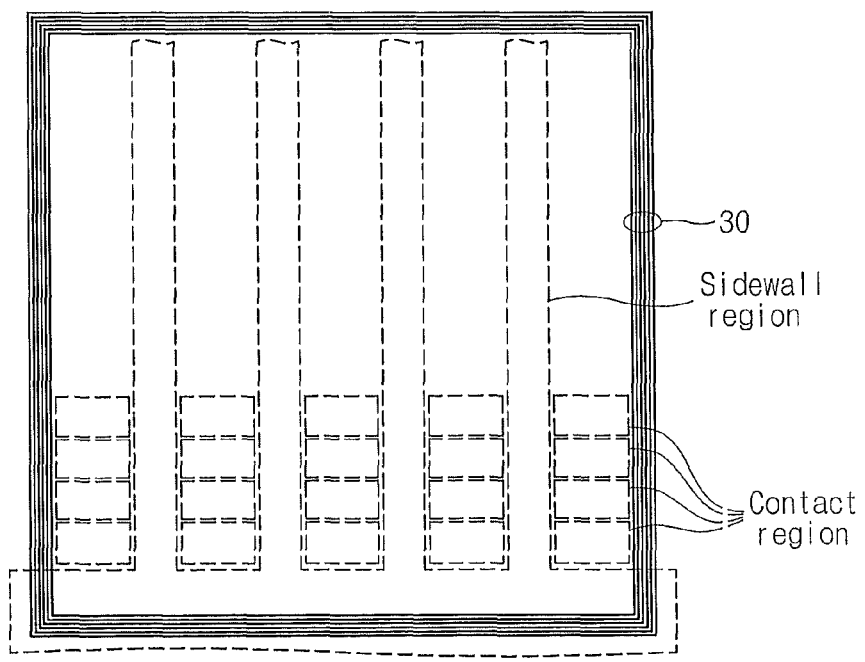
FIG. 23 is a plan view illustrating the formation of contact portions of line and space patterns including side wall regions thereof in some embodiments according to the invention.

FIGS. 23-26 are figures that illustrate the formation of contact portions in some embodiments according to the invention. FIG. 23 is a plan view of a stair step pattern of contact portions within the contact region including a sidewall region of the conductive lines 30.

Figure 24:
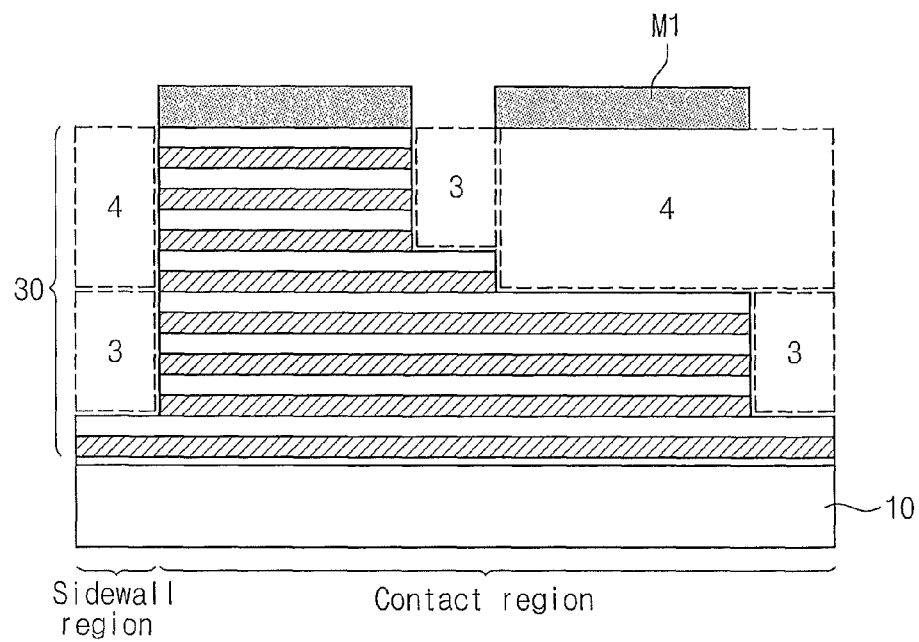
FIGS. 24-26 are cross sectional views illustrating the formation of contact portions of line and space patterns including side wall regions thereof in some embodiments according to the invention.

According to FIG. 24, a mask is formed on the layers 30 where the mask exposes locations within the layers 30, which correspond to half of the contact portions to be formed therein (not shown in FIG. 24). Subsequent to this step, a first mask M1 is formed on the layers 30 to cover more than half of the contact portions to be formed within layers 30. The mask M1 is then used to etch the remaining layers 30 that are exposed by the mask M1.

In particular, more than half of the remaining layers exposed by the mask M1 can be removed by etching. For example, in FIG. 24 three of the remaining four layers exposed by the mask M1 at a location close pointing to contact portion 1 are removed. Furthermore, three layers of the word plate lines 30 are also removed at a position corresponding to contact portion 5. It will also be understood that the sidewall region of the conductive lines shown in FIG. 23 can be etched simultaneous with the layers that are etched to define the contact portions within the contact region.

Figure 25:
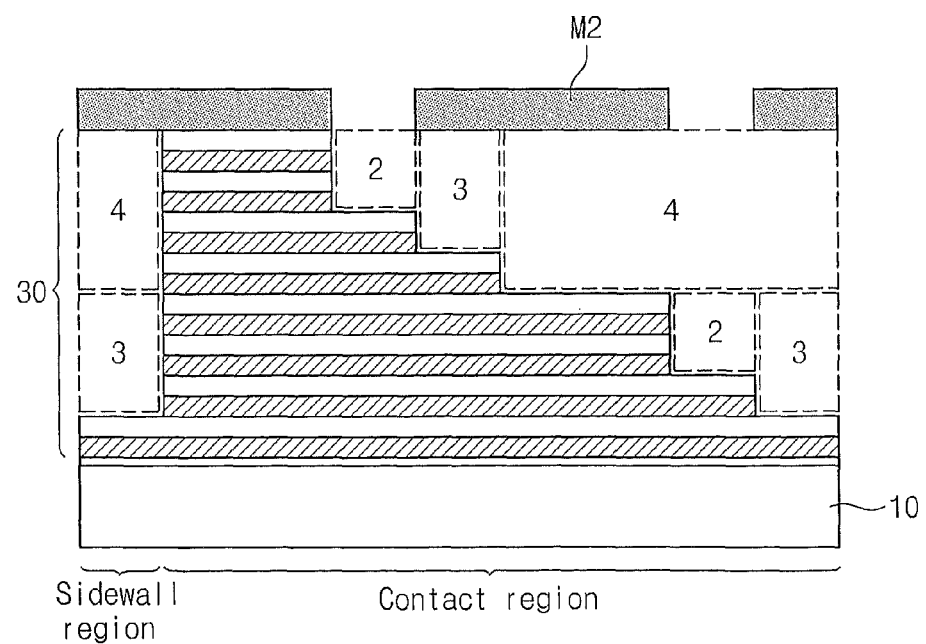
Figure 26:
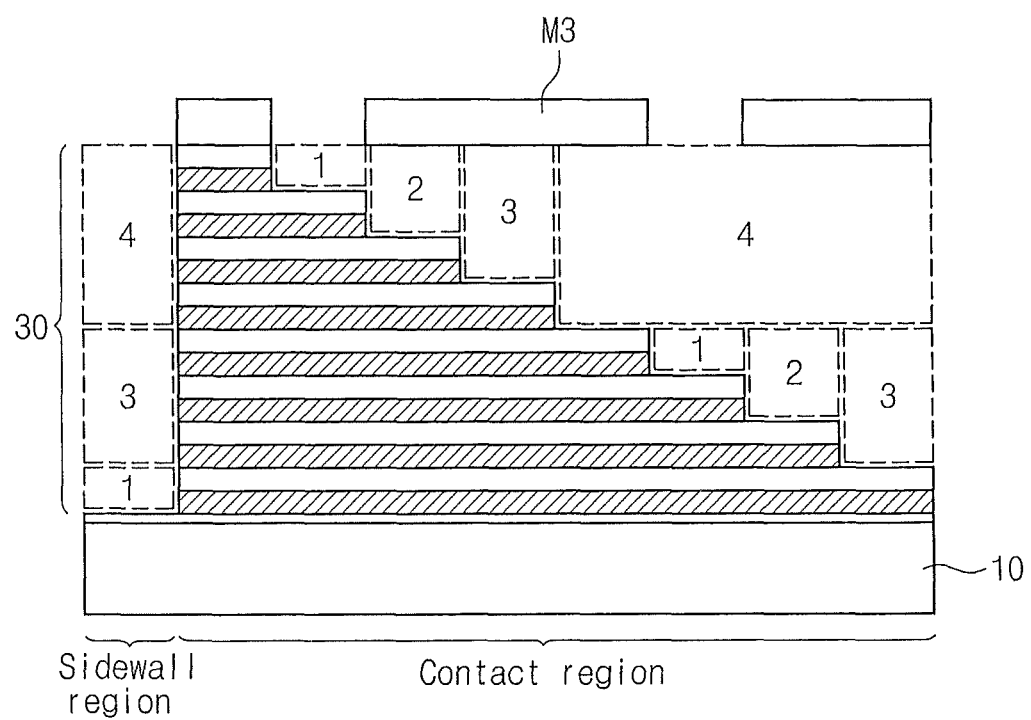

In a next step, FIG. 25 illustrates that a second mask M2 is formed therein to cover more than half of the contact portions and including covering the sidewall region. During etching, two of the remaining layers exposed by the mask M2 are removed. According to FIG. 26, a third mask is formed to cover more than half of the contact portions and to expose the sidewall region. During the etching step, a single one of the layers exposed by the mask M3 is removed so as to define 8 contact portions arranged in the stair step configuration as described herein.

Figure 27:
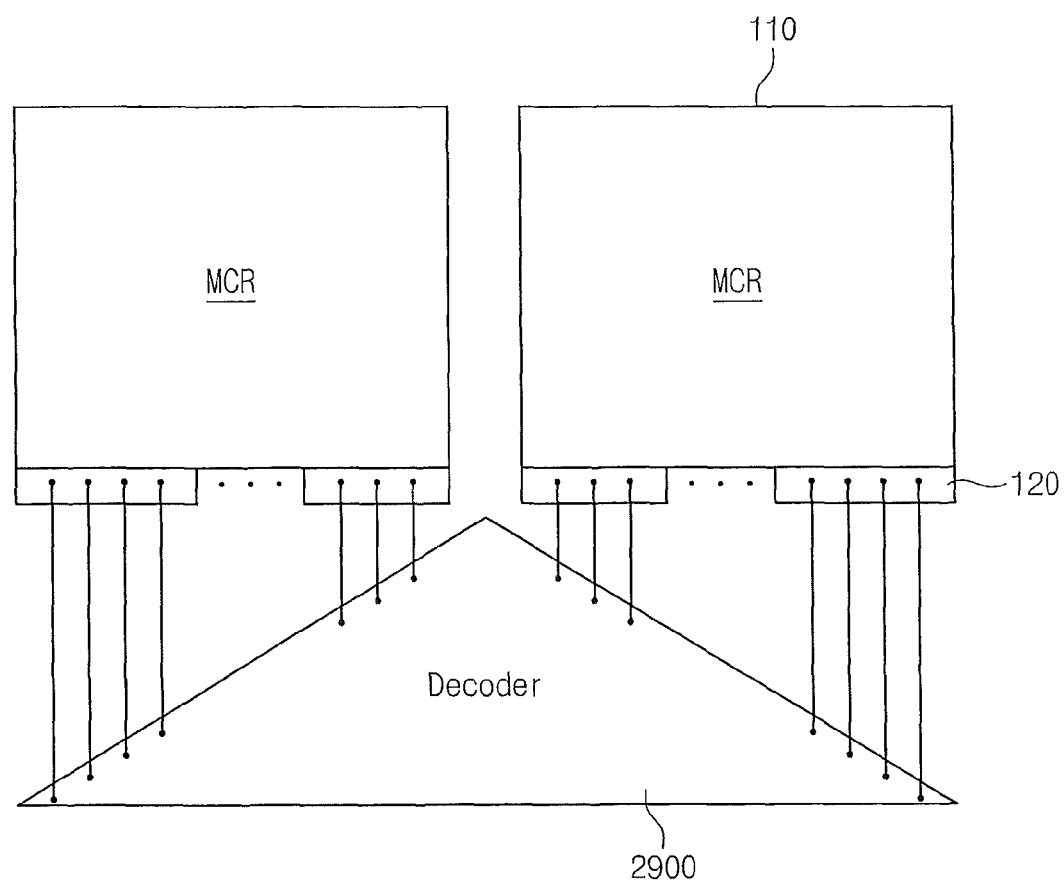
FIG. 27 is a schematic view illustrating a decoder circuit coupled to memory cell regions having memory devices therein including vertical NAND strings with contact portions in some embodiments according to the invention.

FIG. 27 is a block diagram that illustrates a decoder circuit 2900 having signal lines electrically connected to vertical NAND strings within the memory cell regions 110. In particular, the decoder circuits 2900 are coupled to the cells within the MCR region 110 by contact portions within the contact region 120 as described herein.

Figure 28:
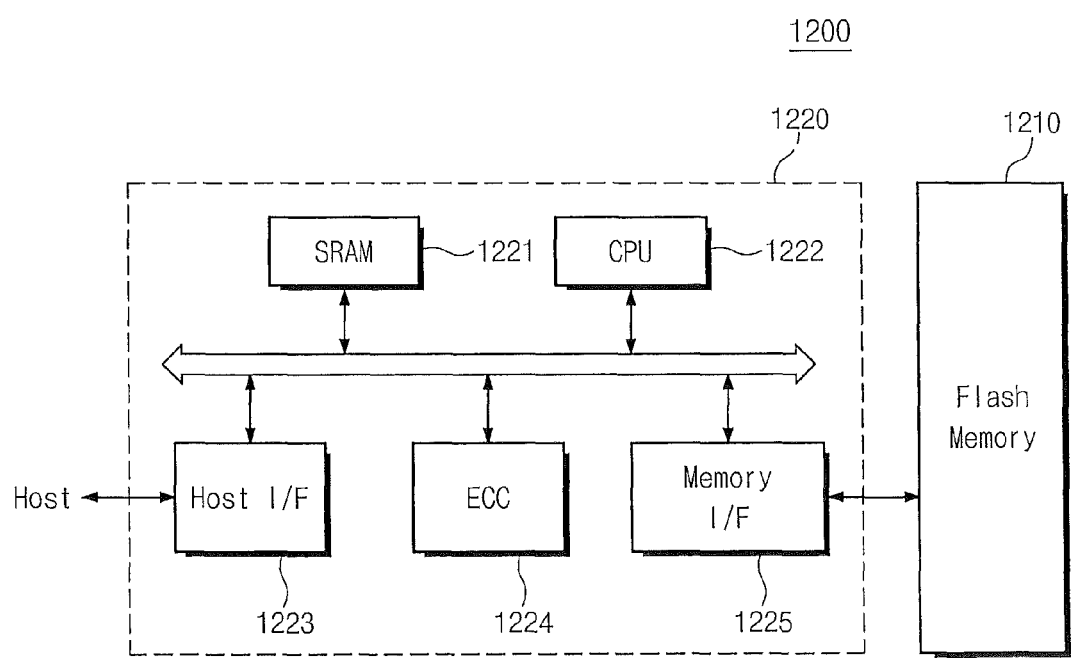
FIG. 28 is a block diagram that illustrates a memory card including memory devices having vertical NAND strings therein in some embodiments according to the invention.

FIG. 28 is a schematic representation of a memory card 1200 including non-volatile (flash) memory devices 1210 in some embodiments according to the present invention. The memory card 1200 also includes a controller circuit 1220 to coordinate operations of the memory card including a CPU 1222, SRAM 1221, a Host Interface (I/F) Circuit 1223, and Error Correction Circuit 1224 and a Memory Interface (I/F) Circuit 1225.

Figure 29:
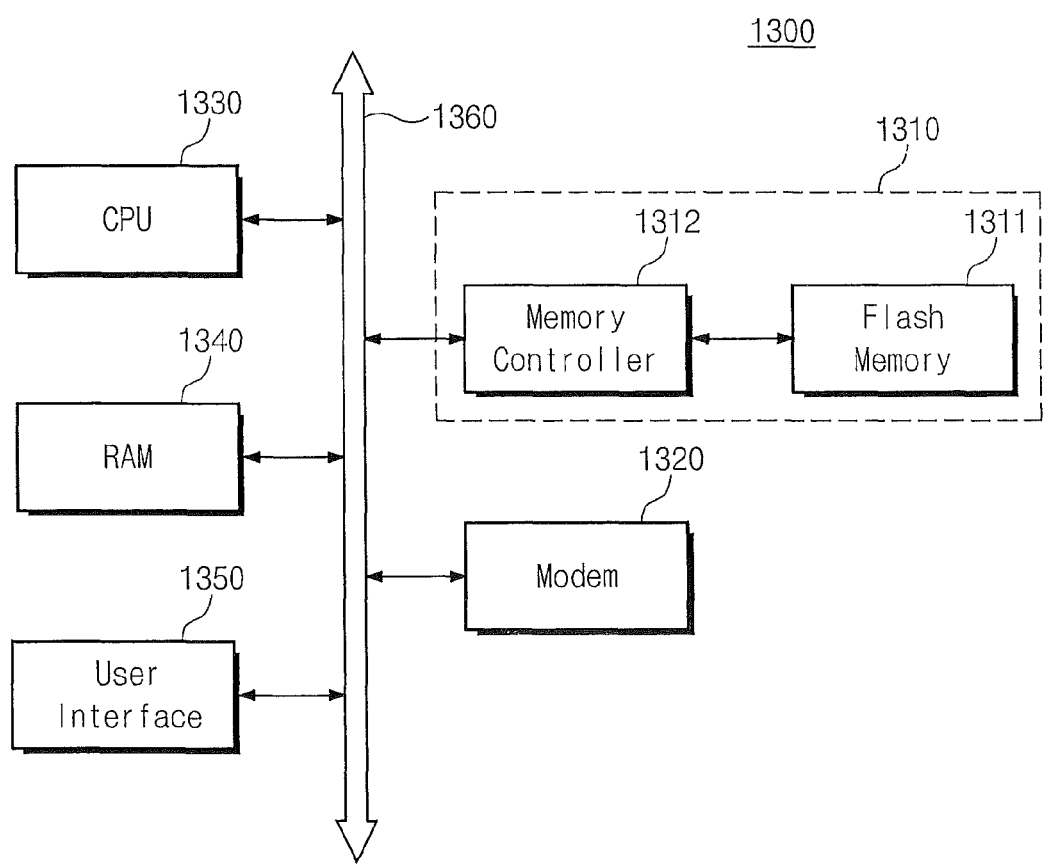
FIG. 29 is a block diagram that illustrates a memory system including non-volatile memory devices with vertical NAND strings therein in some embodiments according to the invention.

FIG. 29 is a block diagram of a memory system 1310 (including a memory controller 1312 and a flash memory 1311) coupled to a system that includes a CPU 1330, RAM 1340, a User Interface 1350, a Modem 1320, all of which are connected by a bus 1360. It will be understood that the devices used to implement the devices can all be implemented using contact portion of word line plates in vertical NAND structures in some embodiments according to the invention.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming a Vertical NAND (VNAND) structure comprising:
    alternatingly stacking first layers and second layers to form a stack comprising first and second portions, each of which comprises first and second parts;
    forming a first mask pattern to cover the first portion and expose the second portion;
    etching the second portion using the first mask pattern as an etch mask;
    forming a second mask pattern to cover the first parts of the first and second portions and expose the second parts of the first and second portions; and
    etching the second parts of the first and second portions using the second mask pattern as an etch mask.

2. The method of claim 1, wherein the first part of the first portion of the VNAND structure has a thickness greater than a thickness of the first part of the second portion of the VNAND structure.

3. The method of claim 1, wherein the first part of the first portion of the VNAND structure has a thickness greater than a thickness of the second part of the first portion of the VNAND structure.

4. The method of claim 1, wherein the first part of the second portion of the VNAND structure has a thickness greater than a thickness of the second part of the second portion of the VNAND structure.

5. The method of claim 1, wherein the etching the second portion comprises:
    forming a first contact portion having a first height and a second contact portion having a second height less than the first height.

6. The method of claim 5, wherein the etching the second parts comprises:
    forming a third contact portion having a third height which is less than the first height and is greater than the second height and a fourth contact portion having a fourth height less than the second height.

7. The method of claim 6, wherein the second contact portion is disposed between the third contact portion and the fourth contact portion, and the third contact portion is disposed between the first contact portion and the second contact portion.

8. The method of claim 6, wherein a difference between the first height and the third height is a difference between a second height and the fourth height.

9. The method of claim 6, wherein the first, the second, the third and the fourth contact portions are arranged along one direction.

10. The method of claim 1, wherein at least one of the etching steps is performed in such a way that the number of the first and the second layers to be etched is 2n, where n is zero or positive integers.

11. The method of claim 1, wherein the etching of the second portion using the first mask pattern forms at least one first etched region with a first etch depth, and
    the etching of the second parts of the first and second portions using the second mask pattern forms at least one second etched region with a second etch depth,
    wherein the first etch depth is different from the second etch depth.

12. The method of claim 11, wherein one of the first and second etch depths is substantially twice the other.

13. The method of claim 11, wherein the stack further comprises a cell region, on which a plurality of bit lines are provided.

14. The method of claim 13, wherein the at least one first etched region comprises a plurality of first etched regions formed equidistant from one of the plurality of the bit lines, and
    the at least one second etched region comprises a plurality of second etched regions formed equidistant from another of the plurality of the bit lines.

15. The method of claim 14, wherein a distance between the first etched regions and a specific one of the bit lines is substantially equal to a distance between the second etched regions and the specific one of the bit lines.

16. The method of claim 13, wherein the at least one first etched region is formed at a position spaced apart from a specific one of the bit lines by a first distance, and
    the at least one second etched region is formed at a position spaced apart from the specific one of the bit lines by a second distance different from the first distance.

17. The method of claim 1, wherein the etching of the second portion using the first mask pattern is performed to etch n layers of the first layers, and
    the etching of the second parts of the first and second portions using the second mask pattern is performed to etch m layers of the first layers,
    wherein m is an integer that is different from n.

18. The method of claim 17, wherein n is an integer of (m+2) or more.

19. The method of claim 17, wherein n is 2m.

* * * * *